United States Patent [19]

Novosel et al.

[11] Patent Number: 4,800,297

[45] Date of Patent: Jan. 24, 1989

[54] SOURCE BIAS GENERATOR FOR NATURAL TRANSISTORS IN MOS DIGITAL INTEGRATED CIRCUITS

[75] Inventors: David Novosel, West Middlesex, Pa.; Giovanni Campardo, Bergamo, Italy

[73] Assignee: SGS Microelecttronica spa, Catania, Italy

[21] Appl. No.: 56,866

[22] Filed: Jun. 1, 1987

[30] Foreign Application Priority Data

Jun. 3, 1986 [IT]  Italy ................. 20660 A/86

[51] Int. Cl.$^4$ ................ H03K 3/013; H03K 17/16; H03K 17/687; G11C 11/40

[52] U.S. Cl. ................. 307/296 R; 307/581; 307/449; 307/354; 307/530; 365/227; 323/315

[58] Field of Search ............ 307/296.6–296.8, 307/574, 576, 578, 581, 585, 354, 449, 463, 530, 571, 584; 323/313, 315; 365/226, 227

[56] References Cited

U.S. PATENT DOCUMENTS

| | | |
|---|---|---|
| 3,761,899 | 9/1973 | Mckenny et al. ............ 307/463 X |
| 4,535,259 | 8/1985 | Smarandoui et al. ......... 307/468 X |
| 4,689,495 | 8/1987 | Liu .............................. 307/578 |
| 4,701,634 | 10/1987 | Schuetz et al. ................ 307/576 |
| 4,714,845 | 12/1987 | Devecchi et al. ............. 307/576 |

Primary Examiner—Stanley D. Miller
Assistant Examiner—David R. Bertelson
Attorney, Agent, or Firm—Wolf, Greenfield & Sacks

[57] ABSTRACT

The bias voltage generator is particularly intended for EPROM memory address decoder circuits, and comprises:

(a) a stage generating a reference voltage approximately equal to the turn off threshold voltage of a natural transistor, with its sign changed; and (b) a doubler stage driven by the reference voltage and adapted to supply a bias voltage equal to twice the turn off threshold voltage with its sign changed.

Preferably, the bias voltage generator furthermore comprises an adjustment stage driven by the output bias voltage to inject an additional current in negative feedback into said doubler stage when the output bias voltage drops, to return it to the desired value.

17 Claims, 1 Drawing Sheet

SOURCE BIAS GENERATOR FOR NATURAL TRANSISTORS IN MOS DIGITAL INTEGRATED CIRCUITS

BACKGROUND OF THE INVENTION

The present invention relates to a bias voltage generator circuit for the source of natural transistors which are part of MOS digital integrated circuits, with the aim of allowing the turn off of said transistors simply by grounding their gate. More in particular, the invention is intended to find a mostly advantageous application in line decoding in EPROM memories and the like.

In address decoders of EPROM memories employing natural transistors, it is not sufficient to merely ground their gates to inhibit them, since their turn off threshold is approximately $-100$ mV. It is thus necessary to bias their source to a positive voltage greater than the turn off threshold, and this is conventionally achieved by means of a resistor arranged in series on the source.

Production processes for natural transistors and for resistors, however, are heterogeneous. Thus the process variations entailed by this solution lead to differences which in the worst cases can cause the integrated circuits to fail their operating specifications, and in any case reduce the uniformity of characteristics from one chip to the next. Temperature and power supply variations also have different effects in the two cases, and thus cause the overall circuit to be less tolerant to such variations.

SUMMARY OF THE INVENTION

The main aim of the invention is therefore to provide a source bias voltage generator for natural transistors which is affected by process, temperature and power supply variations in a manner identical to that of natural transistors, and thus avoids the above described problems.

In particular, the aim of the invention is to provide a bias voltage generator of the above described type, which supplies a bias voltage related to the turn off threshold of natural transistors, and more in particular the bias voltage being twice the amplitude of the threshold.

The above objects and advantages, and others as will become apparent hereinafter, are achieved by the invention with a source bias voltage generator for natrual transistors, particularly for digital integrated circuits such as EPROM memories, characterized in that it comprises:

(a) a stage generating a reference voltage approximately equal to the turn off threshold voltage of a natural transistor, with its sign changed; and (b) a doubler stage driven by said reference voltage and adapted to supply a bias voltage equal to twice the turn off threshold voltage with its sign changed.

According to a further preferred characteristic, said bias voltage generator furthermore comprises an adjustment stage driven by the output bias voltage to inject an additional current in negative feedback into the doubler stage when the output bias voltage drops, to return it to the desired value.

BRIEF DESCRIPTION OF THE DRAWINGS

A preferred embodiment of a bias voltage generator circuit for sources of natural transistors, according to the invention, is now described with reference to the accompanying drawings, where.

DESCRIPTION OF THE PREFERRED EMBODIMENTS

Figure 1:
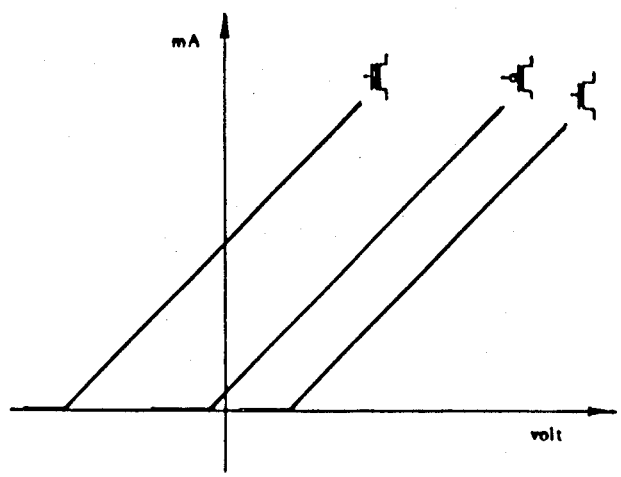
FIG. 1 is a graph of characteristic curves typical of three types of transistors employed in the circuit according to the invention.

In the circuit diagrams, the transistors represented with their channel in thick lines are depletion transistors: the transistors represented with their channel in thin lines are enhancement transistors; while the transistors represented with a small circle on the gate are natural transistors. The graph of FIG. 1 illustrates the characteristic curves, typical of the three types of transistors. The voltage V between the gate and the source is plotted in volts on the ordinate, while the current I passing through the channel is plotted in milliamperes on the abscissa. The bend in each curve represents the turn off threshold $V_T$ for the related transistor.

The preferred embodiment is supposed implemented in NMOS technology, therefore with a positive supply voltage $V_{cc}$.

Figure 2:
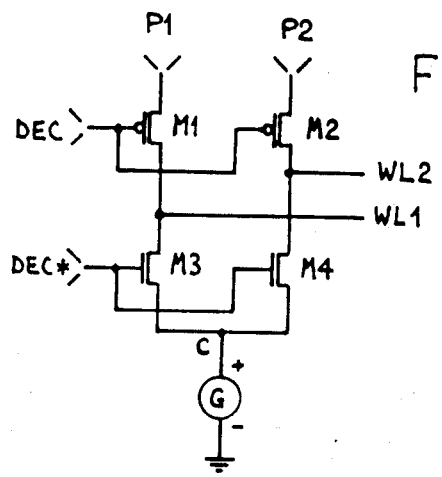
FIG. 2 is a circuit diagram of a part of a line decoder for an EPROM memory, whereto is applicable the bias generator according to the invention.

FIG. 2 is a partial illustration of the diagram of a row decoder for an EPROM memory. The natural transistors M1, M2 are the pass transistors of two word lines WL1, WL 2, with enhancement transistors M3, M4 between their respective sources and a bias voltage generator G. The gates of the transistors M1, M2, and the gates of the transistors M3, M4, are driven by respective decoder signals DEC, $\overline{\text{DEC}}$ while P1, P2 are the signals to be applied to the respective word lines.

In order to have the line WL1 go high, DEC will have to be made high, so that $\overline{\text{DEC}}$ will automatically be low, and P1 will also be high, while P2 will have to be grounded. However, with the aim of optimizing room on the chip, the signals P are common to several pass transistors, so it is necessary to ensure that when DEC is grounded (and therefore $\overline{\text{DEC}}$ is high) the natural transistor M2 is off. Since transistor M2 has a negative threshold, if the node C were grounded transistor M2 would instead be on, so that it is necessary to provide a bias G which keeps the node C at a positive voltage level greater than the amplitude of the threshold voltage of transistor M2.

For this purpose, as mentioned above, a conventional solution is to arrange a resistor in series to generate the desired voltage drop, but in this case the variations in process would be heterogeneous for the various components of the circuit.

Figure 3:
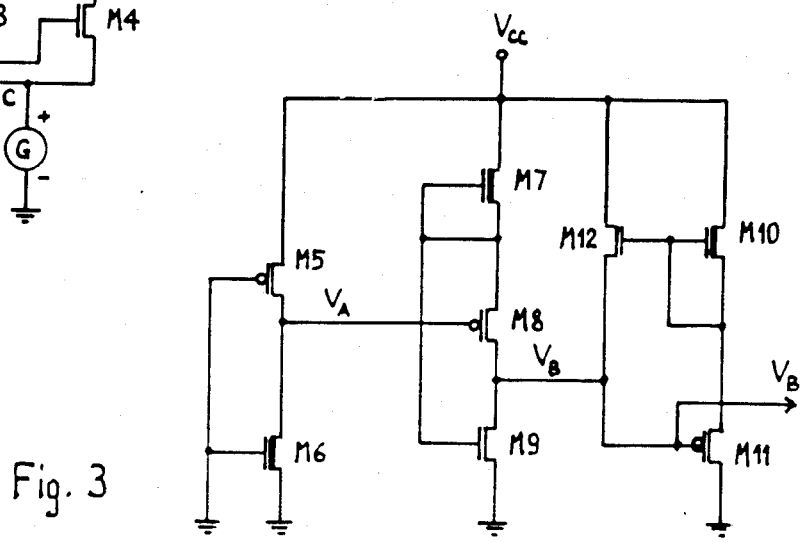
FIG. 3 is a diagram of the bias generator for integrated circuits, according to the preferred embodiment of the invention.

According to the invention, a circuit is used as bias voltage generator G which, in its preferred embodiment, is illustrated in FIG. 3.

The circuit comprises a reference voltage generator consisting of a natural transistor M5 and of a depletion transistor M6, connected in series between the supply Vcc and the ground, and with both gates connected to the ground. Moreover, transistor M6 is provided with a great channel length, while transistor M5 is provided with a great channel width, so that the channel current I is very small. In this manner the following relation is valid:

$$I = \frac{W5}{L5} * (-V_A - V_{Tnat})^2 * k_{nat}' \simeq 0$$

from which it follows that $$V_A \simeq -V_{Tnat}. \quad (1)$$

The reference voltage $V_A$ is applied at the input to a second circuit stage, which input consists of the gate of a natural transistor M8 having its source connected to the ground through an enhancement transistor M9 implemented so as to be very conductive, and the drain connected to the power supply Vcc through a depletion transistor M7 implemented so as to be very resistive, and having its source connected to the gate to simulate a resistive load. The drain of transistor M8 is furthermore connected to the gate of transistor M9 to create a negative feedback. In this manner the transistor M8 operates at the knee of its characteristic, thus there being the limitation:

$$V_A - V_B = V_{Tnat},$$

from which, taking into account equation (1):

$$V_B = -2 * V_{Tnat}.$$

The voltage $V_B$ obtained is again applied, as well as to the user circuit, also to a third adjustment stage comprising a depletion transistor M10, a natural transistor M11, and an enhancement transistor M12. The transistor M12 is diode connected to act as a load for transistor M11, the latter being driven on its gate by the signal $V_B$. The drain of transistor M11 is connected to drive the gate of transistor M10.

Normally, (when $V_B$ is at the value $-2*V_{Tnat}$), M11 transistor and M12 are on, while M10 is off. However, if $V_B$ drops, transistor M10 is activated to supply a transistor M9 with a contribution of recovery current and restore the desired value of $V_B$.

A preferred embodiment of the invention has been described, but naturally the same is susceptible to equivalent modifications and variations, within the scope of the inventive concept.

We claim:

1. A source bias voltage generator for natural transistors each having a source, a drain, a gate driven by a control signal, and having a negative turn-off threshold voltage, particularly for digital integrated circuits such as EPROM memories, characterized in that said generator comprises:
   (a) a reference voltage generator stage supplied by a supply voltage and generating a reference voltage approximately equal to the turn-off threshold voltage of a natural transistor, with its sign changed; and
   (b) a doubler stage driven by said reference voltage and supplying a bias voltage equal to twice said reference voltage.

2. A bias voltage generator according to claim 1, characterized in that said reference voltage generator stage comprises a first natural transistor having a gate and a relatively wide channel and a first depletion transistor having a gate and a relatively long channel, said transistors being connected in series between said supply voltage and a ground voltage, and with the gates of both said transistors connected to the ground voltage, said reference voltage being the voltage at the point of connection between said two transistors.

3. A bias voltage generator according to claim 1, characterized in that said doubler stage comprises a second natural transistor having a drain, a source and a gate, and driven by said reference voltage and having its source biased by a first; very conductive enhancement transistor having a gate, and its drain supplied from said supply voltage through a first, diode-connected, very resistive depletion transistor, the drain voltage of said second natural transistor being fed back to the gate of said first enhancement transistor, the voltage at the source of the second natural transistor being the output bias voltage.

4. A bias voltage generator according to claim 3, characterized in that it furthermore comprises an adjustment stage driven by said output bias voltage to inject an additional current into said first enhancement transistor when said output bias voltage drops with respect to the desired value.

5. A bias voltage generator according to claim 4, characterized in that said adjustment stage comprises a second enhancement transistor having a gate, a drain connected to the supply voltage and a source connected to the output bias voltage, and a third natural transistor having a gate driven by said output bias voltage and having a load comprising a second, diode-connected depletion transistor, the drain of said third natural transistor driving the gate of said second enhancement transistor.

6. A source bias voltage generator for natural transistors each having a source, a drain, a gate driven by a control signal, and having a negative turn-off threshold voltage, said generator comprising; means defining a supply voltage, a reference voltage generator stage including a natural transistor and means responsive to said supply voltage for generating a reference voltage approximately equal to the negative turn-off threshold voltage of said natural transistor and a second stage including means responsive to said reference voltage for outputting a bias voltage that is greater than said reference voltage.

7. A bias voltage generator according to claim 6 wherein said second stage comprises a doubler stage providing a supply voltage approximately equal to twice said reference voltage.

8. A bias voltage generator according to claim 6 wherein said reference voltage generator stage comprises a first natural trasistor having a gate and a relatively wide channel and a first depletion transistor having a gate and a relatively long channel, said transistors being connected in series between said supply voltage and a ground voltage, and with the gates of both said transistors connected to the ground voltage, said reference voltage being the voltage at the point of connection between said two transistors.

9. A bias voltage generator according to claim 6 wherein said second stage comprises a second natural transistor having a drain, a source and a gate, and driven by said reference voltage.

10. A bias voltage generator according to claim 9 including a first enhancement transistor having a gate with the source of said second natural transistor biased by said first enhancement transistor.

11. A bias voltage generator according to claim 10 including a first diode-connected depletion transistor, the drain of said second natural transistor being supplied from said supply voltage through said first depletion transistor.

12. A bias voltage generator according to claim 11 wherein the drain voltage of said second natural transistor is fed back to the gate of said first enhancement transistor and the voltage at the source of said second natural transistor is the output bias voltage.

13. A bias voltage generator according to claim 12 further comprising an adjustment stage driven by said output bias voltage to inject an additional current into said first enhancement transistor when the output bias voltage drops with respect to the desired value.

14. A bias voltage generator according to claim 13 wherein said adjustment stage comprises a second enhancement transistor having a gate, a drain connected to the supply voltage and a source connected to the output bias voltage, and a third natural transistor having a gate driven by said output bias voltage and having a load.

15. A bias voltage generator according to claim 14 wherein said load comprises a second, diode-connected depletion transistor, the drain of said third natural transistor driving the gate of said second enhancement transistor.

16. A bias voltage generator according to claim 6 further comprising an adjustment stage driven by the output bias voltage.

17. A bias voltage generator according to claim 16 wherein said second stage comprises a first enhancement transistor, said adjustment stage being driven by the output bias voltage to inject an additional current into said first enahncement transistor when said output bias voltage drops with respect to the desired value.

* * * * *